(12) United States Patent
Cheng

(10) Patent No.: US 11,476,812 B2
(45) Date of Patent: Oct. 18, 2022

(54) AMPLIFYING APPARATUS

(71) Applicant: RichWave Technology Corp., Taipei (TW)

(72) Inventor: Ting-Yuan Cheng, Taipei (TW)

(73) Assignee: RichWave Technology Corp., Taipei (TW)

(*) Notice: Subject to any disclaimer, the term of this patent is extended or adjusted under 35 U.S.C. 154(b) by 0 days.

(21) Appl. No.: 17/505,638

(22) Filed: Oct. 20, 2021

(65) Prior Publication Data

US 2022/0045652 A1     Feb. 10, 2022

Related U.S. Application Data

(62) Division of application No. 17/027,728, filed on Sep. 22, 2020, now Pat. No. 11,196,393.

(30) Foreign Application Priority Data

Nov. 21, 2019 (TW) ................................ 108142233

(51) Int. Cl.
| | |
|---|---|
| *G05F 1/46* | (2006.01) |
| *G05F 1/56* | (2006.01) |
| *H03K 5/24* | (2006.01) |
| *H03F 3/04* | (2006.01) |
| *H03K 19/0175* | (2006.01) |

(52) U.S. Cl.
CPC ........ *H03F 3/04* (2013.01); *H03K 19/017509* (2013.01)

(58) Field of Classification Search
None
See application file for complete search history.

(56) References Cited

U.S. PATENT DOCUMENTS 8,283,981 B2 * 10/2012 Wakamatsu ........ H03F 3/45946
330/258

* cited by examiner

*Primary Examiner* — Kenneth B Wells
(74) *Attorney, Agent, or Firm* — RichWave Technology Corp.

(57) ABSTRACT

An amplifying apparatus includes a zero point generating circuit, a level shift circuit, a transistor, and an amplifying circuit. A first terminal of the zero point generating circuit is coupled to an output terminal of the amplifying apparatus. A first terminal of the level shift circuit is coupled to the output terminal of the amplifying apparatus. A first terminal of the transistor is coupled to a supply voltage. A second terminal of the transistor is coupled to the output terminal of the amplifying apparatus. A control terminal of the transistor is coupled to a second terminal of the level shift circuit. An input terminal of the amplifying circuit is coupled to an input terminal of the amplifying apparatus. An output terminal of the amplifying circuit is coupled to the output terminal of the amplifying apparatus.

10 Claims, 4 Drawing Sheets

AMPLIFYING APPARATUS

CROSS-REFERENCE TO RELATED APPLICATION

This application is a divisional application of and claims the priority benefit of U.S. application Ser. No. 17/027,728, filed on Sep. 22, 2020, now U.S. Pat. No. 11,196,393, which claims the priority benefit of Taiwan application no. 108142233, filed on Nov. 21, 2019. The entirety of each of the above-mentioned patent applications is hereby incorporated by reference herein and made a part of this specification.

BACKGROUND OF THE DISCLOSURE

1. Field of the Disclosure

The disclosure relates to an electronic circuit, and in particular, to an amplifying apparatus.

2. Description of Related Art

An amplifying apparatus and a voltage-to-current conversion apparatus are common components of an electronic apparatus. It is one of important subjects of an electronic circuit to make the amplifying apparatus and the voltage-to-current conversion apparatus have a better phase margin and voltage gain.

SUMMARY OF THE DISCLOSURE

The disclosure provides an amplifying apparatus to amplify a signal.

The amplifying apparatus in the disclosure includes a zero point generating circuit, a first level shift circuit, a first transistor, a second transistor, and a first amplifying circuit. A first terminal of the zero point generating circuit is coupled to a first output terminal of the amplifying apparatus. A first terminal of the first level shift circuit is directly coupled to the first output terminal of the amplifying apparatus. A first terminal of the first transistor is coupled to a first supply voltage. A second terminal of the first transistor is coupled to the first output terminal of the amplifying apparatus. A control terminal of the first transistor is coupled to a second terminal of the first level shift circuit. An input terminal of the first amplifying circuit is coupled to a first input terminal of the amplifying apparatus. An output terminal of the first amplifying circuit is coupled to the first output terminal of the amplifying apparatus. Wherein, the zero point generating circuit comprises a capacitive circuit and a resistive circuit. A first terminal of the capacitive circuit is coupled to a second terminal of the zero point generating circuit. A second terminal of the capacitive circuit is coupled to a third terminal of the zero point generating circuit. A first terminal of the resistive circuit is coupled to the first terminal of the zero point generating circuit. A second terminal of the resistive circuit is coupled to the third terminal of the zero point generating circuit. A first terminal of the second transistor is coupled to a second supply voltage. A second terminal of the second transistor is coupled to the third terminal of the zero point generating circuit to provide a first bias voltage. The third terminal of the zero point generating circuit is coupled to a connection node between the resistive circuit and the capacitive circuit. A control terminal of the second transistor is coupled to the second terminal of the first level shift circuit.

The amplifying apparatus in the disclosure includes a zero point generating circuit, a first level shift circuit, a first transistor, a first amplifying circuit, a second transistor, a second level shift circuit, an third transistor, and a second amplifying circuit. A first terminal of the zero point generating circuit is coupled to a first output terminal of the amplifying apparatus. A first terminal of the first level shift circuit is coupled to the first output terminal of the amplifying apparatus. A first terminal of the first transistor is coupled to a first supply voltage. A second terminal of the first transistor is coupled to the first output terminal of the amplifying apparatus. A control terminal of the first transistor is coupled to a second terminal of the first level shift circuit. An input terminal of the first amplifying circuit is coupled to a first input terminal of the amplifying apparatus. An output terminal of the first amplifying circuit is coupled to the first output terminal of the amplifying apparatus. A first terminal of the second transistor is coupled to a second output terminal of the amplifying apparatus. A second terminal of the zero point generating circuit is coupled to a second supply voltage or the second terminal of the first level shift circuit. A third terminal of the zero point generating circuit is coupled to a second terminal and a control terminal of the second transistor. The second terminal of the second transistor and the control terminal of the second transistor are coupled together. A first terminal of the second level shift circuit is coupled to the second output terminal of the amplifying apparatus. A first terminal of the third transistor is coupled to a third supply voltage. A second terminal of the third transistor is coupled to the second output terminal of the amplifying apparatus. A control terminal of the third transistor is coupled to a second terminal of the second level shift circuit. An input terminal of the second amplifying circuit is coupled to a second input terminal of the amplifying apparatus. An output terminal of the second amplifying circuit is coupled to the second output terminal of the amplifying apparatus. The control terminal of the second transistor receives a first bias voltage.

In order to make the aforementioned and other objectives and advantages of the disclosure more comprehensible, embodiments accompanied with figures are described in detail below.

DESCRIPTION OF THE EMBODIMENTS

Figure 1:
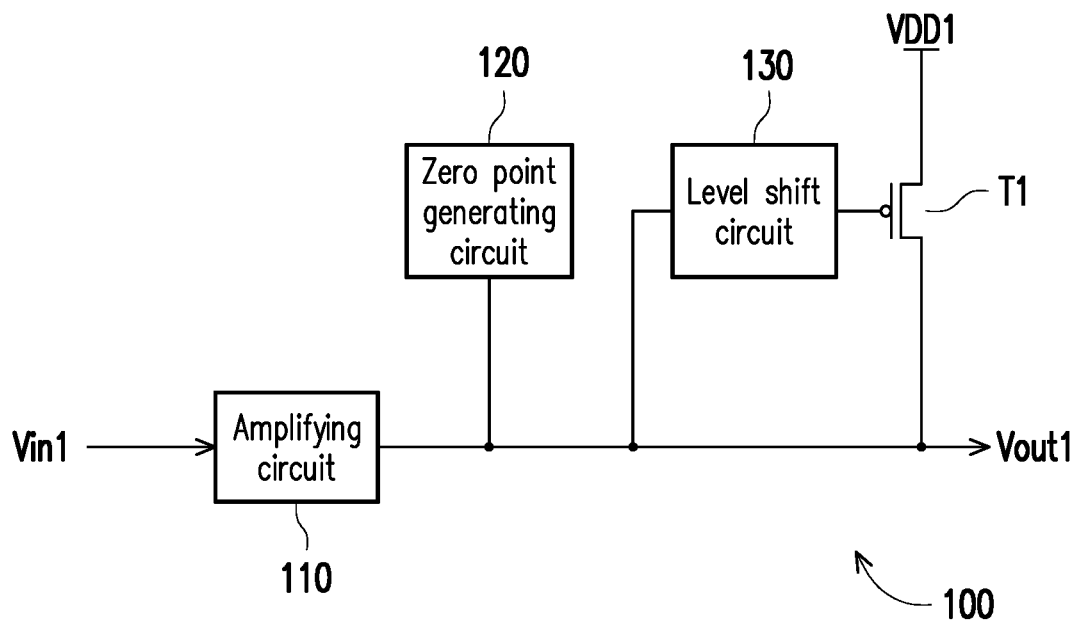
FIG. 1 is a schematic circuit block diagram of an amplifying apparatus according to an embodiment of the disclosure.

The term "coupled to (or connected to)" used throughout this specification (including the claims) of this disclosure may refer to any direct or indirect connection means. For example, if a first apparatus is coupled to (or connected to) a second apparatus in the description of this specification, it should be interpreted as follows: The first apparatus may be directly connected to the second apparatus, or the first apparatus may be indirectly connected to the second apparatus by using another apparatus or in some connection means. The terms such as "first" or "second" mentioned throughout this specification (including the claims) of this disclosure are used to name elements, or to distinguish between different embodiments or scopes, and are neither intended to specify an upper limit or a lower limit of a quantity of the elements, nor to limit an order of the elements. In addition, wherever possible, elements/components/steps with same reference numbers in the drawings and implementations represent same or similar parts. Elements/components/steps with same reference numbers or described by using same terms in different embodiments may refer to each other for related descriptions.

FIG. 1 is a schematic circuit block diagram of an amplifying apparatus 100 according to an embodiment of the disclosure. The amplifying apparatus 100 shown in FIG. 1 includes an amplifying circuit 110, a zero point generating circuit 120, a level shift circuit 130, and a transistor T1. A first terminal (for example, a source) of the transistor T1 is coupled to a supply voltage (for example, a supply voltage VDD1 or other fixed voltages). A level of the supply voltage VDD1 may be set according to a design requirement. A second terminal (for example, a drain) of the transistor T1 is coupled to an output terminal Vout1 of the amplifying apparatus 100. In the embodiment shown in FIG. 1, the transistor T1 is implemented by using a p-channel metal oxide semiconductor (PMOS) transistor. However, implementations of the transistor T1 should not be limited thereto. According to the design requirements, in other embodiments, the transistor T1 may be other types of transistors.

An input terminal of the amplifying circuit 110 is coupled to an input terminal Vin1 of the amplifying apparatus 100. An output terminal of the amplifying circuit 110, a first terminal of the zero point generating circuit 120, and a first terminal of the level shift circuit 130 are coupled to the output terminal Vout1 of the amplifying apparatus 100. The zero point generating circuit 120 may generate a zero point, to make a phase margin of the amplifying apparatus greater than 0° (for example, but not limited to, 45° or 60°), and to stabilize the amplifying apparatus 100. Further, to improve a gain of the amplifying apparatus 100, a control terminal (for example, a gate) of the transistor T1 is coupled to a second terminal of the level shift circuit 130, so that the level shift circuit 130 and the transistor T1 form a gain loop to amplify an output signal of the amplifying apparatus 100.

Figure 2:
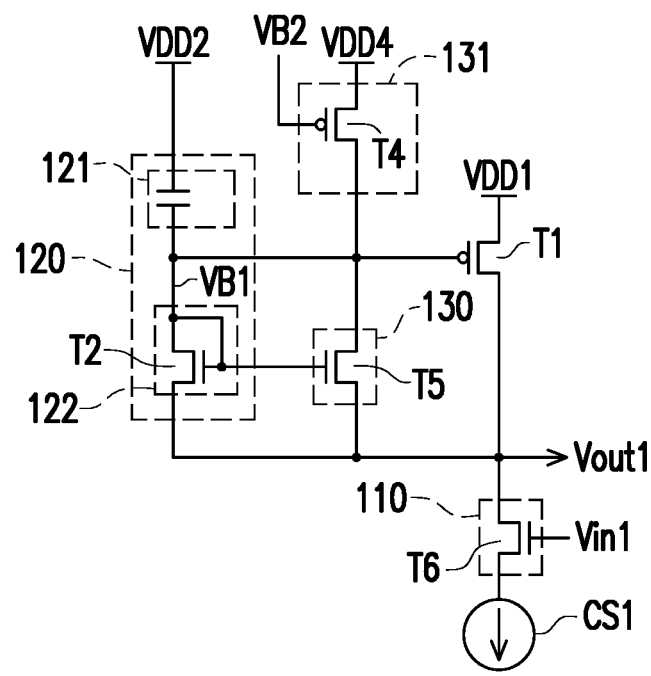
FIG. 2 is a schematic circuit diagram of an amplifying circuit, a zero point generating circuit, and a level shift circuit shown in FIG. 1 according to an embodiment of the disclosure.

FIG. 2 is a schematic circuit diagram of the amplifying circuit 110, the zero point generating circuit 120, and the level shift circuit 130 shown in FIG. 1 according to an embodiment of the disclosure. The zero point generating circuit 120 shown in FIG. 2 includes a capacitive circuit 121 and a resistive circuit 122. According to a design requirement, the capacitive circuit 121 includes a parasitic capacitor and/or a physical capacitor. A first terminal of the capacitive circuit 121 is coupled to the second terminal of the zero point generating circuit 120. In the embodiment shown in FIG. 2, the second terminal of the zero point generating circuit 120 may be coupled to a supply voltage (for example, a supply voltage VDD2 or other fixed voltages). A level of the supply voltage VDD2 may be set according to design requirements. A second terminal of the capacitive circuit 121 is coupled to a third terminal of the zero point generating circuit 120. In the embodiment shown in FIG. 2, the third terminal of the zero point generating circuit 120 may be coupled to the second terminal of the level shift circuit 130 and the control terminal of the transistor T1. The capacitive circuit 121 may generate a Miller effect. That is, due to amplification by an amplifier, a capacitance value of the capacitive circuit 121 equivalent to an input terminal may be increased by 1+K times, wherein K is a voltage amplification factor of the amplifier.

A first terminal of the resistive circuit 122 is coupled to the first terminal of the zero point generating circuit 120, that is, to the output terminal Vout1 of the amplifying apparatus 100. A second terminal of the resistive circuit 122 is coupled to the third terminal of the zero point generating circuit 120, that is, to the second terminal of the capacitive circuit 121. In the embodiment shown in FIG. 2, the resistive circuit 122 includes a transistor T2. A first terminal (for example, a source) of the transistor T2 is coupled to the first terminal of the resistive circuit 122, that is, to the output terminal Vout1 of the amplifying apparatus 100. A second terminal (for example, a drain) and a control terminal (for example, a gate) of the transistor T2 are coupled to the second terminal of the resistive circuit 122, that is, to the second terminal of the capacitive circuit 121. The control terminal of the transistor T2 receives a bias voltage VB1 (for example, a drain voltage of the transistor T2). In the embodiment shown in FIG. 2, the transistor T2 is implemented by using an n-channel metal oxide semiconductor (NMOS) transistor. However, implementations of the transistor T2 should not be limited thereto. According to design requirements, in other embodiments, the transistor T2 may be other types of transistors. A level of the bias voltage VB1 may be set according to design requirements.

The amplifying apparatus shown in FIG. 2 further includes a load circuit 131. A first terminal of the load circuit 131 is coupled to a supply voltage (for example, a supply voltage VDD4 or other fixed voltages). A level of the supply voltage VDD4 may be set according to the design requirement. A second terminal of the load circuit 131 is coupled to the second terminal of the level shift circuit 130. In the embodiment shown in FIG. 2, the load circuit 131 includes a transistor T4. A first terminal (for example, a source) of the transistor T4 is coupled to the first terminal of the load circuit 131, that is, to the supply voltage. A second terminal (for example, a drain) of the transistor T4 is coupled to the second terminal of the load circuit 131, that is, to the second terminal of the level shift circuit 130. A control terminal (for example, a gate) of the transistor T4 receives a bias voltage VB2. The bias voltage VB2 may be set according to design requirements. In the embodiment shown in FIG. 2, the transistor T4 is implemented by using a PMOS transistor. However, implementations of the transistor T4 should not be limited thereto. According to design requirements, in other embodiments, the transistor T4 may be other types of transistors. A level of the bias voltage VB2 may be set according to design requirements.

In the embodiment shown in FIG. 2, the level shift circuit 130 includes a transistor T5. A first terminal (for example, a source) of the transistor T5 is coupled to the first terminal of the level shift circuit 130, that is, to the output terminal Vout1 of the amplifying apparatus 100. A second terminal (for example, a drain) of the transistor T5 is coupled to the second terminal of the level shift circuit 130, that is, to the control terminal of the transistor T1. A control terminal (for example, a gate) of the transistor T5 receives the bias voltage VB1. The bias voltage VB1 may be set according to design requirements. For example, the drain of the transistor T2 (that is, the third terminal of the zero point generating circuit 120) may be coupled to the control terminal of the transistor T5, to provide the bias voltage VB1. In the embodiment shown in FIG. 2, the transistor T5 is implemented by using an NMOS transistor. However, implementations of the transistor T5 should not be limited thereto. According to design requirements, in other embodiments, the transistor T5 may be other types of transistors.

Implementations of the level shift circuit 130 should not be limited to the embodiment shown in FIG. 2. In other embodiments, the level shift circuit 130 may include a resistor (not shown), that is, the resistor replaces the transistor T5. A first terminal of the resistor is coupled to the first terminal of the level shift circuit 130, that is, to the output terminal Vout1 of the amplifying apparatus 100. A second terminal of the resistor is coupled to the second terminal of the level shift circuit 130, that is, to the control terminal of the transistor T1.

In the embodiment shown in FIG. 2, the amplifying circuit 110 includes a transistor T6. A control terminal (for example, a gate) of the transistor T6 is coupled to a first input terminal of the amplifying apparatus 100. A first terminal (for example, a drain) of the transistor T6 is coupled to an output terminal of the amplifying apparatus 100. A second terminal (for example, a source) of the transistor T6 is coupled to a current source CS1. According to design requirements, in other embodiments, the second terminal of the transistor T6 may be coupled to a reference voltage. The reference voltage may be determined according to design requirements. For example, the reference voltage may be a ground voltage or other fixed voltages.

Figure 3:
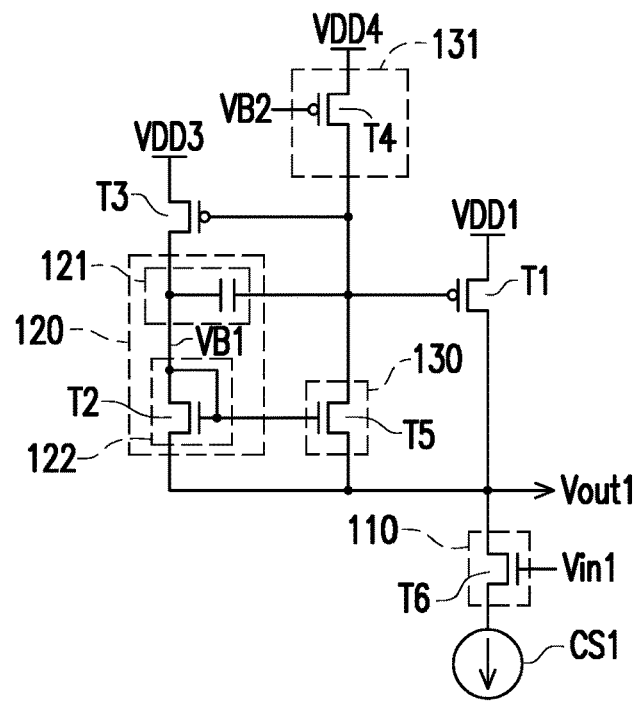
FIG. 3 is a schematic circuit diagram of the zero point generating circuit shown in FIG. 1 according to another embodiment of the disclosure.

FIG. 3 is a schematic circuit diagram of the zero point generating circuit 120 shown in FIG. 1 according to another embodiment of the disclosure. For the amplifying circuit 110, the zero point generating circuit 120, the level shift circuit 130, and the load circuit 131 shown in FIG. 3, refer to related descriptions of FIG. 2, and the descriptions thereof are omitted. In the embodiment shown in FIG. 3, the second terminal of the zero point generating circuit 120 is coupled to the second terminal of the level shift circuit 130. That is, the first terminal of the capacitive circuit 121 is coupled to the second terminal (the drain) of the transistor T5.

In the embodiment shown in FIG. 3, the amplifying apparatus 100 further includes a transistor T3. A first terminal (for example, a source) of the transistor T3 is coupled to a supply voltage (for example, a supply voltage VDD3 or other fixed voltages). A level of the supply voltage VDD3 may be set according to design requirements. A second terminal (for example, a drain) of the transistor T3 is coupled to the third terminal of the zero point generating circuit 120, to provide the bias voltage VB1 to the control terminal of the transistor T2. A control terminal (for example, a gate) of the transistor T3 is coupled to the second terminal of the level shift circuit 130. In the embodiment shown in FIG. 3, the transistor T3 is implemented by using a PMOS transistor. However, implementations of the transistor T3 should not be limited thereto. According to design requirements, in other embodiments, the transistor T3 may be other types of transistors.

Figure 4:
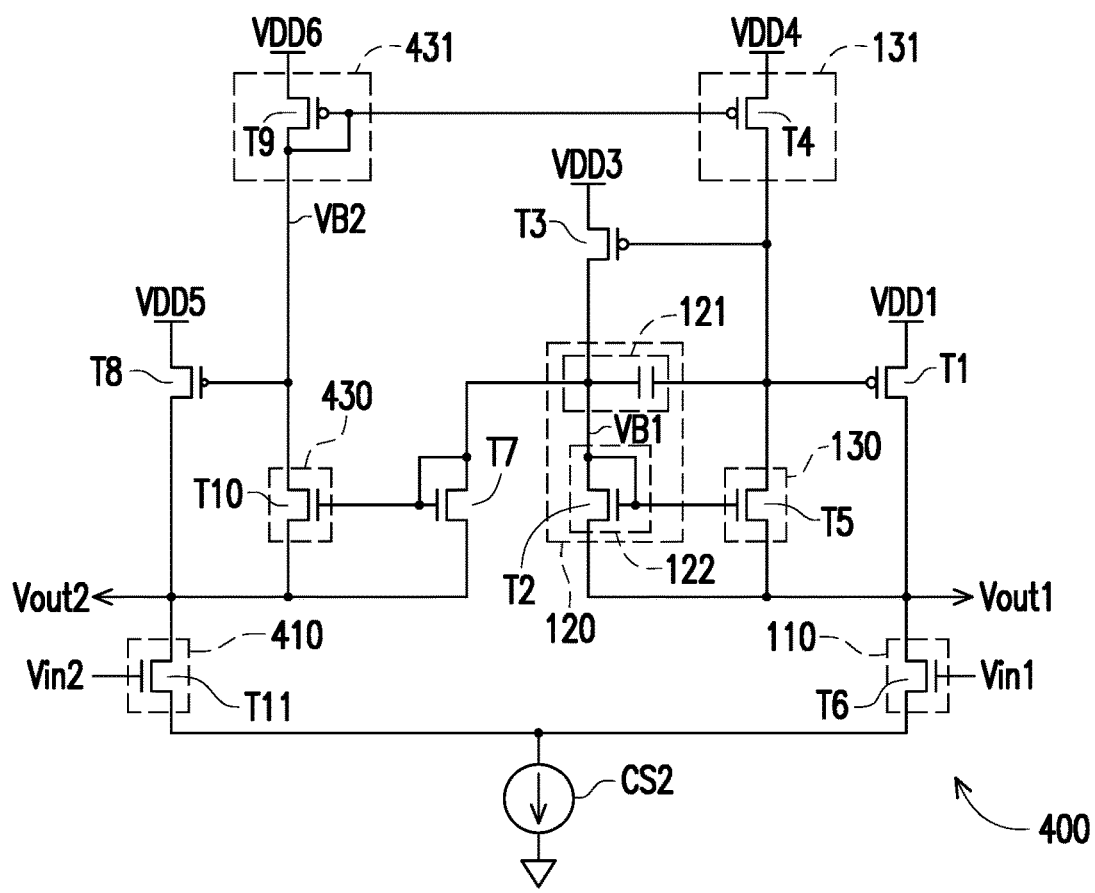
FIG. 4 is a schematic circuit block diagram of an amplifying apparatus according to another embodiment of the disclosure.

FIG. 4 is a schematic circuit block diagram of an amplifying apparatus 400 according to another embodiment of the disclosure. The amplifying apparatus 400 shown in FIG. 4 includes an amplifying circuit 110, a zero point generating circuit 120, a level shift circuit 130, a load circuit 131, a transistor T1, a transistor T3, a transistor T7, a transistor T8, an amplifying circuit 410, a level shift circuit 430 and a load circuit 431. For the transistor T1, the transistor T3, the amplifying circuit 110, the zero point generating circuit 120, the level shift circuit 130, and the load circuit 131 shown in FIG. 4, refer to related descriptions of FIG. 1 to FIG. 3, and the descriptions thereof are omitted.

In the embodiment shown in FIG. 4, a first terminal (for example, a source) of the transistor T7 is coupled to an output terminal Vout2 of the amplifying apparatus 400. A second terminal (for example, a drain) and a control terminal (for example, a gate) of the transistor T7 are coupled to the second terminal of the resistive circuit 121 (that is, the third terminal of the zero point generating circuit 120). The control terminal of the transistor T7 receives the bias voltage VB1 (for example, a drain voltage of the transistor T7). In the embodiment shown in FIG. 4, the transistor T7 is implemented by using an NMOS transistor. However, implementations of the transistor T7 should not be limited thereto. According to design requirements, in other embodiments, the transistor T7 may be other types of transistors.

A first terminal of the level shift circuit 430 is coupled to the output terminal Vout2 of the amplifying apparatus 400. A second terminal of the level shift circuit 430 is coupled to a control terminal (for example, a gate) of the transistor T8. The related description of the level shift circuit 130 may be analogized to the level shift circuit 430. In the embodiment shown in FIG. 4, the level shift circuit 430 includes a transistor T10. A first terminal (for example, a source) of the transistor T10 is coupled to the first terminal of the level shift circuit 430, that is, to the output terminal Vout2 of the amplifying apparatus 400. A second terminal (for example, a drain) of the transistor T10 is coupled to the second terminal of the level shift circuit 430, that is, to the control terminal of the transistor T8. A control terminal (for example, a gate) of the transistor T10 receives the bias voltage VB1. The bias voltage VB1 may be set according to design requirements. For example, the second terminal (the drain) and the control terminal (the gate) of the transistor T7 may be coupled to the control terminal of the transistor T10, to provide the bias voltage VB1. In the embodiment shown in FIG. 4, the transistor T10 is implemented by using an NMOS transistor. However, implementations of the transistor T10 should not be limited thereto. According to design requirements, in other embodiments, the transistor T10 may be other types of transistors.

Implementations of the level shift circuit 430 should not be limited to the embodiment shown in FIG. 4. In other embodiments, the level shift circuit 430 may include a resistor (not shown), that is, the resistor replaces the transistor T10. A first terminal of the resistor is coupled to the first terminal of the level shift circuit 430, that is, to the output terminal Vout2 of the amplifying apparatus 400. A second terminal of the resistor is coupled to the second terminal of the level shift circuit 430, that is, to the control terminal of the transistor T8.

A first terminal of the load circuit 431 is coupled to a supply voltage (for example, a supply voltage VDD6 or other fixed voltages). A level of the supply voltage VDD6 may be set according to design requirements. A second terminal of the load circuit 431 is coupled to the second terminal of the level shift circuit 430. In the embodiment shown in FIG. 4, the load circuit 431 includes a transistor T9. A first terminal (for example, a source) of the transistor T9 is coupled to the first terminal of the load circuit 431, that is, to the supply voltage. A second terminal (for example, a drain) of the transistor T9 is coupled to the second terminal of the load circuit 431, that is, to the second terminal of the level shift circuit 430. A control terminal (for example, a gate) of the transistor T9 receives the bias voltage VB2 (for example, a drain voltage of the transistor T9). The drain of the transistor T9 is further coupled to the control terminal (the gate) of the transistor T4, to provide the bias voltage VB2. In the embodiment shown in FIG. 4, the transistor T9 is implemented by using a PMOS transistor. However, implementations of the transistor T9 should not be limited thereto. According to design requirements, in other embodiments, the transistor T9 may be other types of transistors.

In the embodiment shown in FIG. 4, a first terminal (for example, a source) of the transistor T8 is coupled to a supply voltage (for example, a supply voltage VDD5 or other fixed voltages). A level of the supply voltage VDD5 may be set according to design requirements. A second terminal (for example, a drain) of the transistor T8 is coupled to the output terminal Vout2 of the amplifying apparatus 400. In the embodiment shown in FIG. 4, the transistor T8 is implemented by using a PMOS transistor. However, implementations of the transistor T8 should not be limited thereto. According to design requirements, in other embodiments, the transistor T8 may be other types of transistors.

An input terminal of the amplifying circuit 410 shown in FIG. 4 is coupled to an input terminal Vin2 of the amplifying apparatus 400. An output terminal of the amplifying circuit 410 is coupled to the output terminal Vout2 of the amplifying apparatus 400. In the embodiment shown in FIG. 4, the amplifying circuit 410 includes a transistor T11. A control terminal (for example, a gate) of the transistor T11 is coupled to the input terminal of the amplifying circuit 410, that is, to the input terminal Vin2 of the amplifying apparatus 400. A first terminal (for example, a drain) of the transistor T11 is coupled to the output terminal of the amplifying circuit 410, that is, to the output terminal Vout2 of the amplifying apparatus 400. A second terminal (for example, a source) of the transistor T11 and the second terminal (the source) of the transistor T6 are coupled to a current source CS2.

Figure 5:
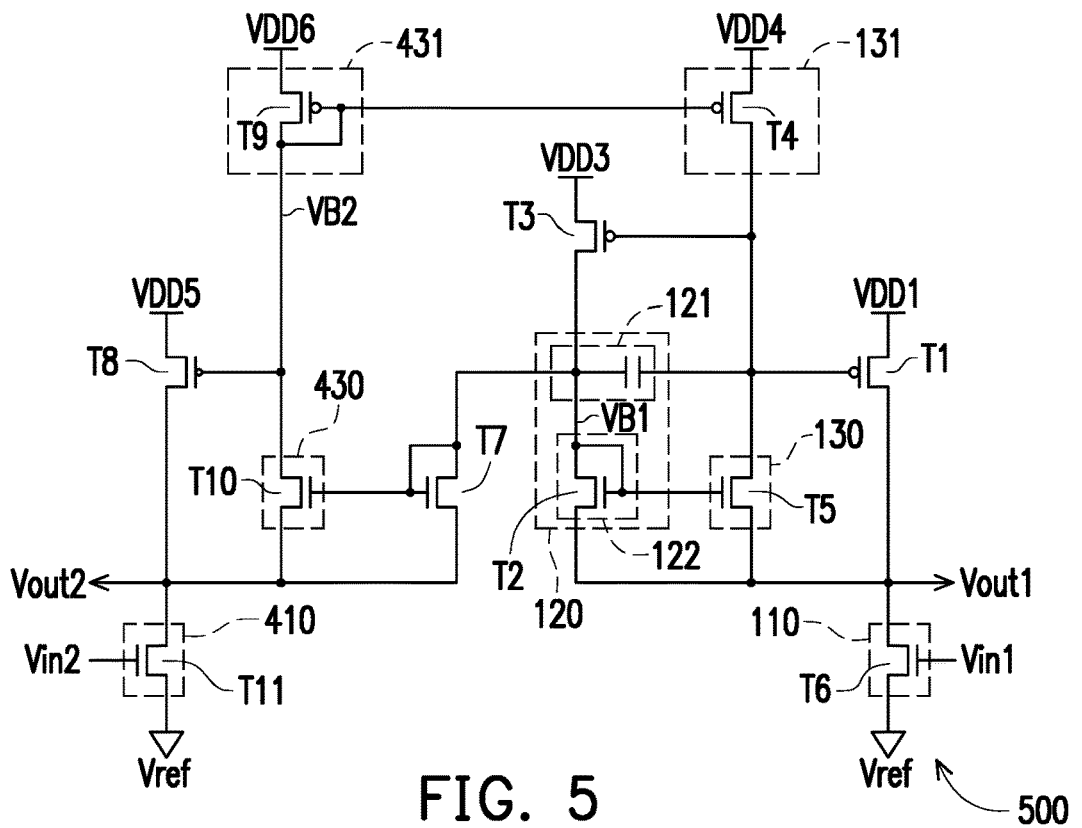
FIG. 5 is a schematic circuit block diagram of an amplifying apparatus according to still another embodiment of the disclosure.

FIG. 5 is a schematic circuit block diagram of an amplifying apparatus 500 according to still another embodiment of the disclosure. The amplifying apparatus 500 shown in FIG. 5 includes an amplifying circuit 110, a zero point generating circuit 120, a level shift circuit 130, a load circuit 131, a transistor T1, a transistor T3, a transistor T7, a transistor T8, an amplifying circuit 410, a level shift circuit 430 and a load circuit 431. For the amplifying circuit 110, the zero point generating circuit 120, the level shift circuit 130, the load circuit 131, the transistor T1, the transistor T3, the transistor T7, the transistor T8, the amplifying circuit 410, the level shift circuit 430, and the load circuit 431 shown in FIG. 5, refer to related descriptions of FIG. 4, and the descriptions thereof are omitted.

According to design requirements, in the embodiment shown in FIG. 5, the second terminal (the source) of the transistor T11 and the second terminal (the source) of the transistor T6 may be coupled to a reference voltage Vref. The reference voltage Vref may be determined according to design requirements. For example, the reference voltage Vref may be a ground voltage or other fixed voltages.

Figure 6:
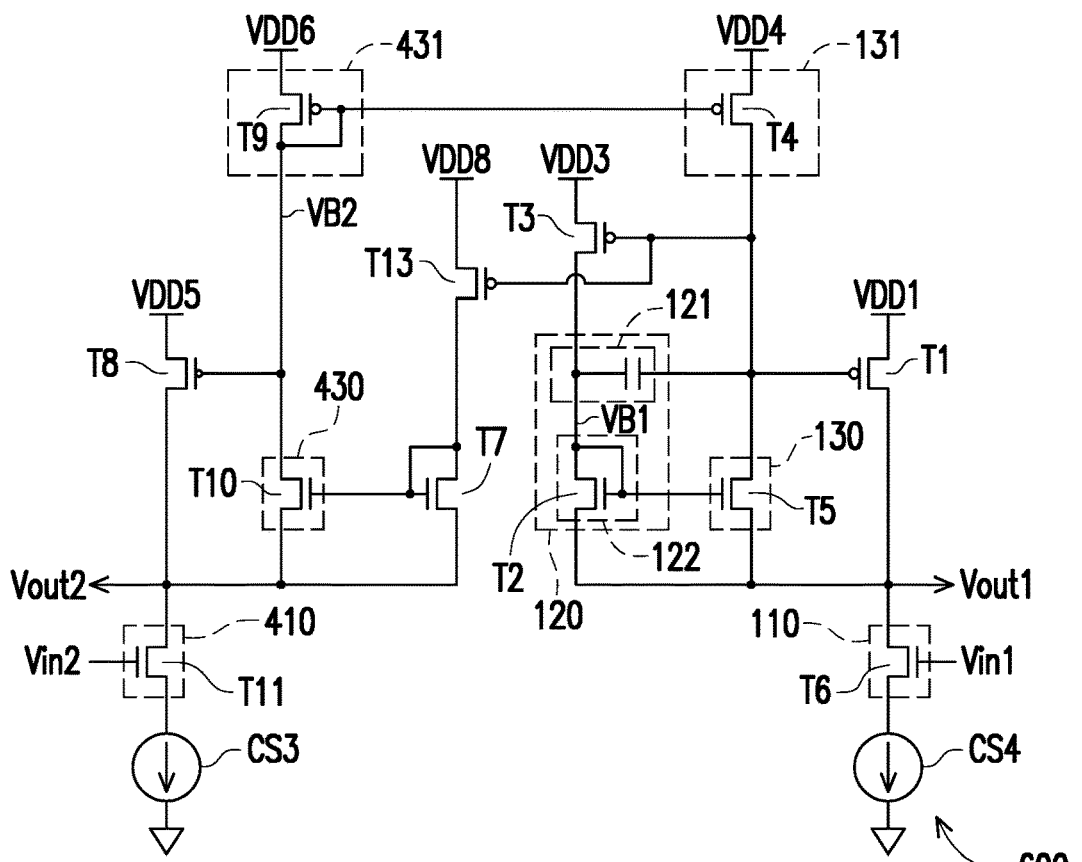
FIG. 6 is a schematic circuit block diagram of an amplifying apparatus according to yet another embodiment of the disclosure.

FIG. 6 is a schematic circuit block diagram of an amplifying apparatus 600 according to yet another embodiment of the disclosure. The amplifying apparatus 600 shown in FIG. 6 includes an amplifying circuit 110, a zero point generating circuit 120, a level shift circuit 130, a load circuit 131, a transistor T1, a transistor T3, a transistor T7, a transistor T8, a transistor T13, an amplifying circuit 410, a level shift circuit 430 and a load circuit 431. For the amplifying circuit 110, the zero point generating circuit 120, the level shift circuit 130, the load circuit 131, the transistor T1, the transistor T3, the transistor T7, the transistor T8, the amplifying circuit 410, the level shift circuit 430, and the load circuit 431 shown in FIG. 6, refer to related descriptions of FIG. 4, and the descriptions thereof are omitted.

In the embodiment shown in FIG. 6, a first terminal (for example, a source) of the transistor T13 is coupled to a supply voltage (for example, a supply voltage VDD8 or other fixed voltages). A level of the supply voltage VDD8 may be set according to design requirements. A second terminal (for example, a drain) of the transistor T13 is coupled to the second terminal (the drain) of the transistor T7. A control terminal (for example, a gate) of the transistor T13 is coupled to the control terminal (the gate) of the transistor T3. In the embodiment shown in FIG. 6, the second terminal (the source) of the transistor T11 is coupled to a current source CS3. The second terminal (the source) of the transistor T6 is coupled to a current source CS4.

Figure 7:
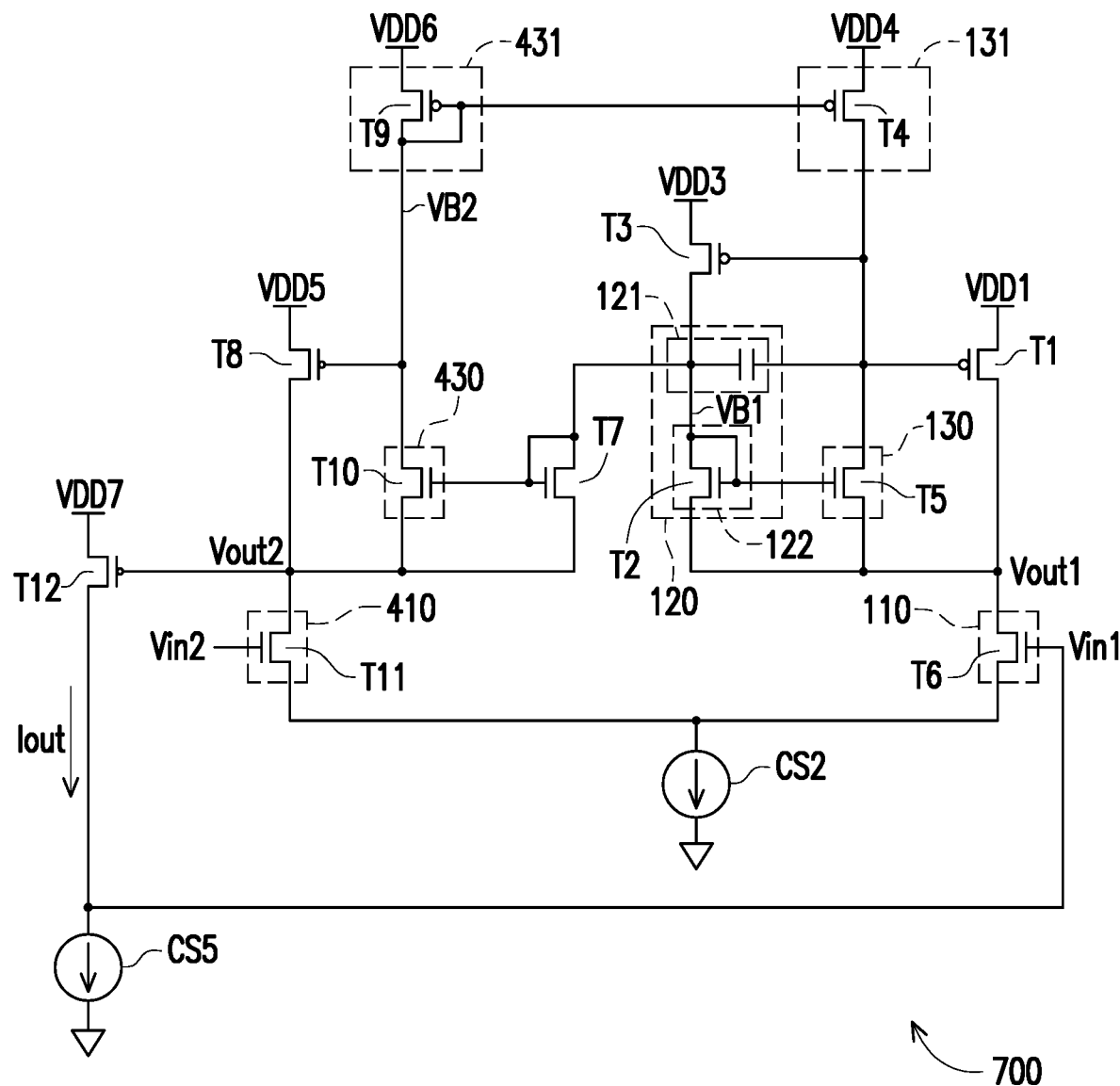
FIG. 7 is a schematic circuit block diagram of a voltage-to-current conversion apparatus according to an embodiment of the disclosure.

FIG. 7 is a schematic circuit block diagram of a voltage-to-current conversion apparatus 700 according to an embodiment of the disclosure. The voltage-to-current conversion apparatus 700 shown in FIG. 7 includes an amplifying circuit 110, a zero point generating circuit 120, a level shift circuit 130, a load circuit 131, a transistor T1, a transistor T3, a transistor T7, a transistor T8, an amplifying circuit 410, a level shift circuit 430 and a load circuit 431. An input terminal Vin1, an input terminal Vin2, an output terminal Vout1, an output terminal Vout2, the amplifying circuit 110, the zero point generating circuit 120, the level shift circuit 130, the load circuit 131, the transistor T1, the transistor T3, the transistor T7, the transistor T8, the amplifying circuit 410, the level shift circuit 430, and the load circuit 431 shown in FIG. 7 may be the amplifying apparatus 400 shown in FIG. 4, and the descriptions thereof are omitted.

The voltage-to-current conversion apparatus 700 shown in FIG. 7 further includes a transistor T12 and a current source CS5. A first terminal (for example, a source) of the transistor T12 is coupled to a supply voltage (for example, a supply voltage VDD7 or other fixed voltages). A level of the supply voltage VDD7 may be set according to design requirements. A second terminal (for example, a drain) of the transistor T12 is coupled to the input terminal Vin1. A control terminal (for example, a gate) of the transistor T12 is coupled to the output terminal Vout2. The current source CS5 is coupled to the second terminal (the drain) of the transistor T12. The voltage-to-current conversion apparatus 700 may convert a voltage of an input terminal Vin2 (that is, an input terminal of the voltage-to-current conversion apparatus 700) into a current Iout.

Based on the above, the zero point generating circuit described in the embodiments of the disclosure may generate a zero point, to make a phase margin of the amplifying apparatus greater than 0° (for example, but not limited to, 45° or 60°), and to stabilize the amplifying apparatus. Further, to improve a gain of the amplifying apparatus 100, the first level shift circuit and the first transistor may form a gain loop, to amplify an output signal of the amplifying apparatus.

Although the disclosure has been disclosed as above with the embodiments, the embodiments are not intended to limit the disclosure. Any person of ordinary skill in the art can make some changes and embellishments without departing from the spirit and scope of the disclosure. Therefore, the protection scope of the disclosure should be subject to the appended patent claims.

What is claimed is:

1. An amplifying apparatus, comprising:
   a zero point generating circuit, having a first terminal coupled to a first output terminal of the amplifying apparatus;
   a first level shift circuit, having a first terminal directly coupled to the first output terminal of the amplifying apparatus;
   a first transistor, having a first terminal coupled to a first supply voltage, wherein a second terminal of the first transistor is coupled to the first output terminal of the amplifying apparatus, and a control terminal of the first transistor is coupled to a second terminal of the first level shift circuit;
   a first amplifying circuit, having an input terminal coupled to a first input terminal of the amplifying apparatus, wherein an output terminal of the first amplifying circuit is coupled to the first output terminal of the amplifying apparatus,
   wherein the zero point generating circuit comprises:
      a capacitive circuit, having a first terminal coupled to a second terminal of the zero point generating circuit, wherein a second terminal of the capacitive circuit is coupled to a third terminal of the zero point generating circuit; and
      a resistive circuit, having a first terminal coupled to the first terminal of the zero point generating circuit, wherein a second terminal of the resistive circuit is coupled to the third terminal of the zero point generating circuit; and
   a second transistor, having a first terminal coupled to a second supply voltage, wherein a second terminal of the second transistor is coupled to the third terminal of the zero point generating circuit to provide a first bias voltage, the third terminal of the zero point generating circuit is coupled to a connection node between the resistive circuit and the capacitive circuit, and a control terminal of the second transistor is coupled to the second terminal of the first level shift circuit.

2. An amplifying apparatus, comprising:
   a zero point generating circuit, having a first terminal coupled to a first output terminal of the amplifying apparatus;
   a first level shift circuit, having a first terminal coupled to the first output terminal of the amplifying apparatus;
   a first transistor, having a first terminal coupled to a first supply voltage, wherein a second terminal of the first transistor is coupled to the first output terminal of the amplifying apparatus, and a control terminal of the first transistor is coupled to a second terminal of the first level shift circuit;
   a first amplifying circuit, having an input terminal coupled to a first input terminal of the amplifying apparatus, wherein an output terminal of the first amplifying circuit is coupled to the first output terminal of the amplifying apparatus;
   a second transistor, having a first terminal coupled to a second output terminal of the amplifying apparatus, wherein a second terminal of the zero point generating circuit is coupled to a second supply voltage or the second terminal of the first level shift circuit, and a third terminal of the zero point generating circuit is coupled to a second terminal and a control terminal of the second transistor, wherein the second terminal of the second transistor and the control terminal of the second transistor are coupled together;
   a second level shift circuit, having a first terminal coupled to the second output terminal of the amplifying apparatus;
   a third transistor, having a first terminal coupled to a third supply voltage, wherein a second terminal of the third transistor is coupled to the second output terminal of the amplifying apparatus, and a control terminal of the third transistor is coupled to a second terminal of the second level shift circuit; and
   a second amplifying circuit, having an input terminal coupled to a second input terminal of the amplifying apparatus, wherein an output terminal of the second amplifying circuit is coupled to the second output terminal of the amplifying apparatus, wherein the control terminal of the second transistor receives a first bias voltage.

3. The amplifying apparatus according to claim 2, further comprising:
   a load circuit, having a first terminal coupled to a fourth supply voltage, wherein a second terminal of the load circuit is coupled to the second terminal of the second level shift circuit.

4. The amplifying apparatus according to claim 3, wherein the load circuit comprises:
   a fourth transistor, having a first terminal coupled to the first terminal of the load circuit, wherein a second terminal of the fourth transistor is coupled to the second terminal of the load circuit, and a control terminal of the fourth transistor receives a second bias voltage.

5. The amplifying apparatus according to claim 3, wherein the second level shift circuit comprises:
   a resistor, having a first terminal coupled to the first terminal of the second level shift circuit, wherein a second terminal of the resistor is coupled to the second terminal of the second level shift circuit.

6. The amplifying apparatus according to claim 2, wherein the second level shift circuit comprises:
   a fourth transistor, having a first terminal coupled to the first terminal of the second level shift circuit, wherein a second terminal of the fourth transistor is coupled to the second terminal of the second level shift circuit, and a control terminal of the fourth transistor receives the first bias voltage.

7. The amplifying apparatus according to claim 6, wherein the control terminal of the fourth transistor is coupled to the control terminal of the second transistor.

8. The amplifying apparatus according to claim 2, wherein the second amplifying circuit comprises:
   a fourth transistor, having a control terminal coupled to the input terminal of the second amplifying circuit, wherein a first terminal of the fourth transistor is coupled to the output terminal of the second amplifying circuit, and a second terminal of the fourth transistor is coupled to a current source or a reference voltage.

9. The amplifying apparatus according to claim 2, further comprising:
   a fourth transistor, having a first terminal coupled to a fourth supply voltage, wherein a second terminal of the fourth transistor is coupled to the first input terminal of the amplifying apparatus, and a control terminal of the fourth transistor is coupled to the second output terminal of the amplifying apparatus; and a current source, coupled to the second terminal of the fourth transistor.

10. The amplifying apparatus according to claim 2, wherein the first terminal of first level shift circuit is coupled to a second terminal of the first transistor, and the amplifying apparatus further comprises:

a first load circuit, having a first terminal coupled to a fourth supply voltage, wherein a second terminal of the first load circuit is coupled to the second terminal of the first level shift circuit, the first terminal of the zero point generating circuit is coupled to the second terminal of the first transistor;

a fourth transistor, having a first terminal coupled to a fifth supply voltage, wherein a second terminal of the fourth transistor is coupled to the third terminal of the zero point generating circuit to provide the first bias voltage, and a control terminal of the fourth transistor is coupled to the second terminal of the first level shift circuit, wherein the first terminal of the second level shift circuit is coupled to a second terminal of the third transistor;

a second load circuit, having a first terminal coupled to a sixth supply voltage, wherein a second terminal of the second load circuit is coupled to the second terminal of the second level shift circuit, the first terminal of the second transistor is coupled to the second terminal of the third transistor, the output terminal of the first amplifying circuit is coupled to the second terminal of the first transistor, and the output terminal of the second amplifying circuit is coupled to the second terminal of the third transistor;

a fifth transistor, having a first terminal coupled to a seventh supply voltage, wherein a second terminal of the fifth transistor is coupled to the input terminal of the first amplifying circuit, and a control terminal of the fifth transistor is coupled to the second terminal of the third transistor; and a current source, coupled to the second terminal of the fifth transistor.

\* \* \* \* \*